US010164024B2

(12) United States Patent
Holland et al.

(10) Patent No.: US 10,164,024 B2
(45) Date of Patent: Dec. 25, 2018

(54) HETEROSTRUCTURES FOR SEMICONDUCTOR DEVICES AND METHODS OF FORMING THE SAME

(71) Applicant: Taiwan Semiconductor Manufacturing Company, Ltd., Hsin-Chu (TW)

(72) Inventors: Martin Christopher Holland, Bertem (BE); Georgios Vellianitis, Heverlee (BE); Richard Kenneth Oxland, Brussels (BE); Krishna Kumar Bhuwalka, Asansol (IN); Gerben Doornbos, Leuven (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/189,913

(22) Filed: Jun. 22, 2016

(65) Prior Publication Data

US 2016/0300911 A1    Oct. 13, 2016

Related U.S. Application Data

(63) Continuation of application No. 13/895,081, filed on May 15, 2013, now Pat. No. 9,385,198.
(Continued)

(51) Int. Cl.
*H01L 29/20* (2006.01)
*H01L 29/205* (2006.01)
(Continued)

(52) U.S. Cl.
CPC ...... *H01L 29/205* (2013.01); *H01L 21/02538* (2013.01); *H01L 29/1054* (2013.01);
(Continued)

(58) Field of Classification Search
CPC .......... H01L 21/02381; H01L 21/0254; H01L 21/02505; H01L 33/007; H01L 29/66636;
(Continued)

(56) References Cited

U.S. PATENT DOCUMENTS 8,283,653 B2    10/2012    Pillarisetty et al.
8,324,660 B2    12/2012    Lochtefeld et al.
(Continued)

FOREIGN PATENT DOCUMENTS

KR    10-0674914 B1    3/2006
KR    101226827 B1    1/2013
(Continued)

OTHER PUBLICATIONS

Madelung, Otfried. Semiconductors: Data Handbook. 3rd edition. Springer-Verlag Berlin Heidelberg New York 2004.*
(Continued)

*Primary Examiner* — Eric A. Ward
*Assistant Examiner* — Eric K Ashbahian
(74) *Attorney, Agent, or Firm* — Slater Matsil, LLP

(57) ABSTRACT

Various heterostructures and methods of forming heterostructures are disclosed. A method includes removing portions of a substrate to form a temporary fin protruding above the substrate, forming a dielectric material over the substrate and over the temporary fin, removing the temporary fin to form a trench in the dielectric material, the trench exposing a portion of a first crystalline material of the substrate, forming a template material at least partially in the trench, the template material being a second crystalline material that is lattice mismatched to the first crystalline material, forming a barrier material over the template material, the barrier material being a third crystalline material, forming a device material over the barrier material, the device material being a fourth crystalline material, forming a gate stack over the
(Continued)

device material, and forming a first source/drain region and a second source/drain region in the device material.

20 Claims, 9 Drawing Sheets

Related U.S. Application Data

(60) Provisional application No. 61/777,541, filed on Mar. 12, 2013.

(51) Int. Cl.
| | |
|---|---|
| H01L 29/778 | (2006.01) |
| H01L 29/66 | (2006.01) |
| H01L 29/78 | (2006.01) |
| H01L 29/10 | (2006.01) |
| H01L 21/02 | (2006.01) |

(52) U.S. Cl.
CPC ........ *H01L 29/20* (2013.01); *H01L 29/66545* (2013.01); *H01L 29/66795* (2013.01); *H01L 29/7787* (2013.01); *H01L 29/785* (2013.01)

(58) Field of Classification Search
CPC ............. H01L 29/66469; H01L 29/205; H01L 29/77878; H01L 29/20; H01L 29/66795; H01L 29/785; H01L 29/1054
USPC ........................................................ 257/190
See application file for complete search history.

(56) References Cited

U.S. PATENT DOCUMENTS

| | | | |
|---|---|---|---|
| 8,519,436 | B2 | 8/2013 | Lochtefeld et al. |
| 8,629,477 | B2 | 1/2014 | Lochtefeld et al. |
| 8,921,191 | B2* | 12/2014 | Cai .................... H01L 27/0886 438/300 |
| 2006/0076625 | A1 | 4/2006 | Lee et al. |
| 2006/0113605 | A1* | 6/2006 | Currie ............. H01L 21/823807 257/368 |
| 2006/0275988 | A1* | 12/2006 | Yagishita .......... H01L 21/82343 438/275 |
| 2006/0292719 | A1 | 12/2006 | Lochtefeld et al. |
| 2007/0267722 | A1 | 11/2007 | Lochtefeld et al. |
| 2008/0073667 | A1* | 3/2008 | Lochtefeld ........ H01L 29/66795 257/190 |
| 2008/0187016 | A1* | 8/2008 | Schowalter ....... H01L 21/02389 372/45.011 |
| 2009/0039361 | A1* | 2/2009 | Li ..................... H01L 21/02381 257/94 |
| 2010/0301390 | A1 | 12/2010 | Ko et al. |
| 2011/0024794 | A1 | 2/2011 | Ko et al. |
| 2011/0049568 | A1 | 3/2011 | Lochtefeld et al. |
| 2011/0147711 | A1* | 6/2011 | Pillarisetty ............. B82Y 10/00 257/24 |
| 2012/0319211 | A1* | 12/2012 | van Dal ............ H01L 29/66795 257/401 |
| 2013/0043536 | A1 | 2/2013 | Rahim et al. |
| 2014/0175515 | A1* | 6/2014 | Then ..................... H01L 29/772 257/194 |
| 2015/0001588 | A1* | 1/2015 | Gunji ................ H01L 21/02587 257/200 |

FOREIGN PATENT DOCUMENTS

| | | |
|---|---|---|
| KR | 101401274 | 5/2014 |
| WO | 2014133293 | 9/2014 |

OTHER PUBLICATIONS

Björk, M. T., et al., "One-dimensional heterostructures in semiconductor nanowhiskers," Applied Physics Letters, Feb. 11, 2002, 4 pages, vol. 80, No. 6, American Institute of Physics.

Björk, M. T., et al., "One-dimensional Steeplechase for Electrons Realized," Nano Letters, American Chemical Society, 2002, pp. 87-89, vol. 2, No. 2.

Glas, F., "Critical dimensions for the plastic relaxation of strained axial heterostructures in free-standing nanowires," Rapid Communications, The American Physical Society, Physical Reveiew B, 2006, pp. 121302-1-121302-3, vol. 74.

\* cited by examiner

HETEROSTRUCTURES FOR SEMICONDUCTOR DEVICES AND METHODS OF FORMING THE SAME

This application is a continuation of and claims priority to U.S. application Ser. No. 13/895,081, filed on May 15, 2013, entitled "Heterostructures for Semiconductor Devices and Methods of Forming the Same," which claims the benefit of U.S. Provisional Application No. 61/777,541, filed on Mar. 12, 2013, entitled "Heterostructures for Semiconductor Devices and Methods of Forming the Same," which applications are hereby incorporated herein by reference in its entirety.

BACKGROUND

The speed of metal-oxide-semiconductor (MOS) transistors is closely related to the drive currents of the MOS transistors, which drive currents are further closely related to the mobility of charges. For example, n-type transistors have high drive currents when the electron mobility in their channel regions is high, while p-type transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V compound semiconductor based transistors have been explored. III-V compound semiconductor films, however, typically need to be grown on other substrates because it is difficult to obtain bulk III-V compound semiconductor crystals. The growth of III-V compound semiconductor films on dissimilar substrates faces difficulties because these substrates can have lattice constants and thermal expansion coefficients different than that of the III-V compound semiconductors. Various methods have been used to form high quality III-V compound semiconductors. Fin Field-Effect Transistors (finFETs) can be formed based on resulting III-V compound semiconductors.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to heterostructures used in semiconductor devices. A specific context discussed herein is heterostructures used for fin field effect transistors (finFETs). Other embodiments may also be applied, however, to semiconductor devices such as planar FETs, high electron mobility transistors (HEMTs), optical devices, or the like. Like references numerals and indicators used in the following figures of embodiments refer to like components. Further, although method embodiments are described in a particular order, other method embodiments may be performed in any logical order.

Figure 1:
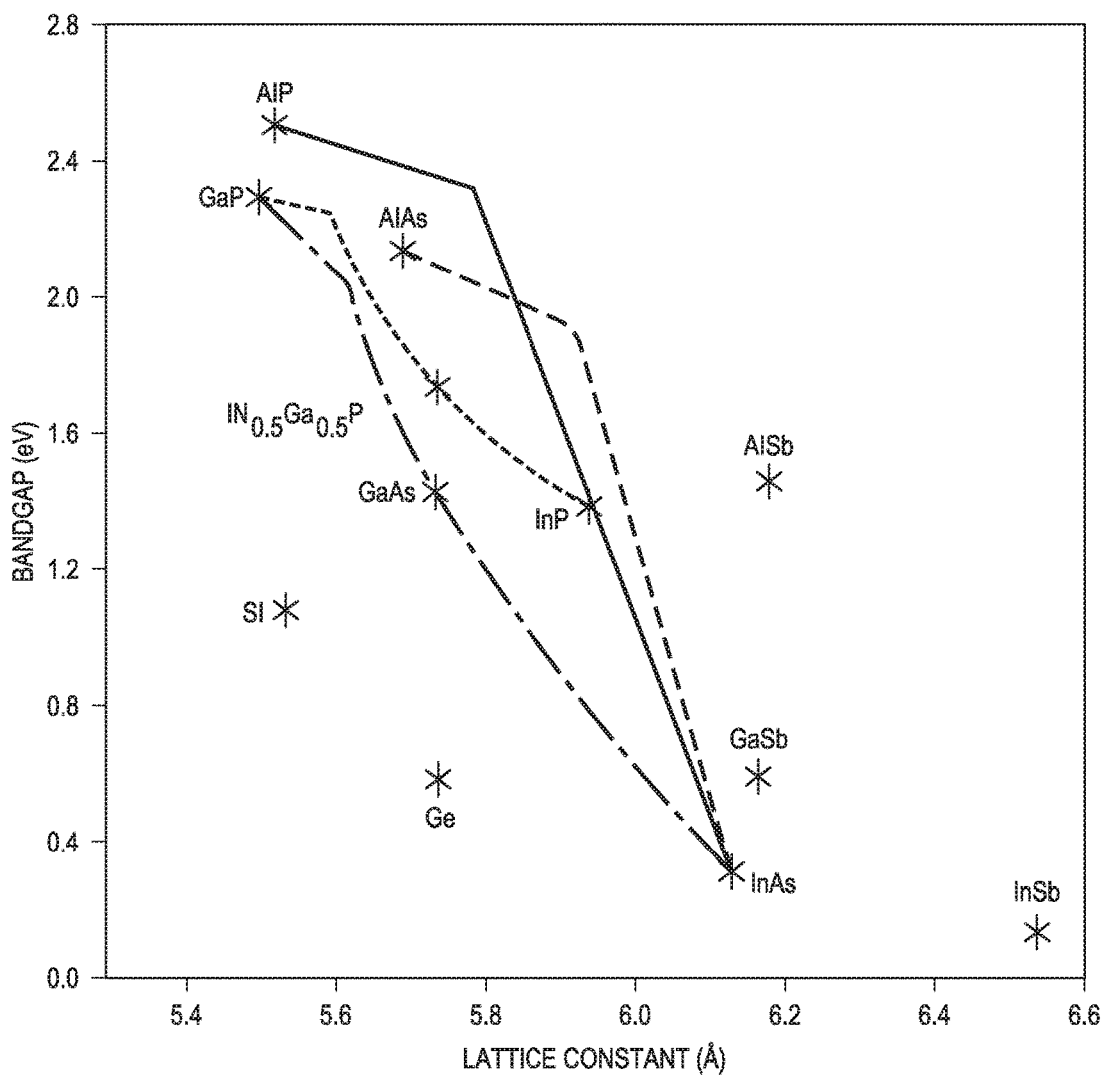
FIG. 1 is a graph showing various elements and compounds in relation to their crystalline lattice constant in Angstroms (Å) and their bandgap energies in electron-volts (eV)

FIG. 1 is a graph showing various elements and compounds in relation to their crystalline lattice constant in Angstroms (Å) and their bandgap energies in electron-volts (eV). The graph shows common bulk substrate materials silicon (Si) and germanium (Ge). The graph further shows many example III-V compound semiconductor materials, with specific binary III-V compound semiconductor material identified and ternary III-V compound semiconductor materials illustrated by lines connecting binary compounds. A person having ordinary skill in the art will readily understand that other ternary compounds are not identified in FIG. 1 by specific lines, but that such ternary compounds exist and are contemplated by embodiments discussed herein. As each line is traversed away from a first binary compound, a molar concentration of the non-common element in the first binary compound decreases, while a molar concentration of the non-common element in the second binary compound increases. For example, using the ternary compound $In_xGa_{1-x}P$, the value x increases as the line is traversed away from GaP towards InP. In this example, phosphorus (P) is the common element, while indium (In) and gallium (Ga) are the non-common elements. $In_{0.5}Ga_{0.5}P$ is illustrated as an example. As seen from FIG. 1, these III-V compound semiconductor materials can have different characteristics that can be desirable for different applications or for different components within an application. Some of these will be discussed in greater detail below.

Figure 2A:
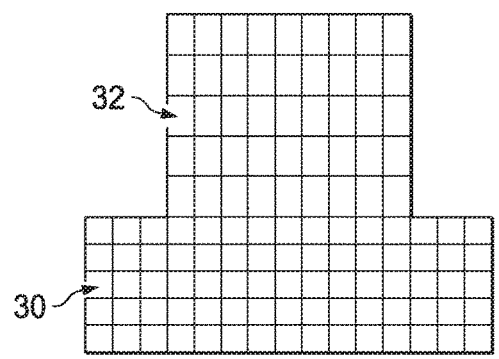
FIGS. 2A, 2B, and 2C illustrate epitaxial growth and relaxation mechanisms in heterostructures.
Figure 2B:
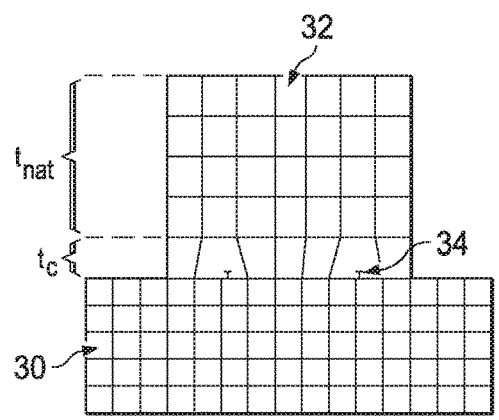
Figure 2C:
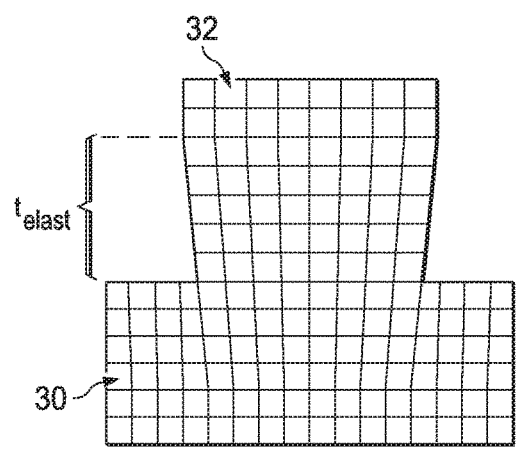

FIGS. 2A, 2B, and 2C illustrate epitaxial growth and relaxation mechanisms in heterostructures. FIG. 2A illustrates a crystalline substrate 30 with a lattice mismatched crystalline material 32 epitaxially grown thereon. FIG. 2A illustrates a simplified example of lattice structures within the crystalline substrate 30 and the crystalline material 32. Assuming a planar deposition of the crystalline material 32 with infinite lateral, in-plane dimensions, e.g., dimensions parallel to the surface or interface where the epitaxial growth occurs like the top surface of the crystalline substrate 30, the epitaxial growth will begin such that the resulting crystalline material 32 will generally be pseudomorphic, e.g., the in-plane lattice structure of the crystalline material 32 will generally match the in-plane lattice structure of the crystalline substrate 30, without the generation of defects. This can be seen in the illustrated lattice structures in FIG. 2A.

As the epitaxial growth continues, stress accumulates within the crystalline material 32 until crystal defects, such as misfit dislocations, are generated to relieve the stress. The thickness of the crystalline material 32 at which this occurs is generally known as the critical thickness. The critical thickness is a function of many factors, including the amount of lattice mismatch between the epitaxially grown material and the underlying crystalline material, which in this example, is the difference between the lattice constants of the crystalline material 32 and the crystalline substrate 30, respectively. The relieving of stress in the crystalline material by the generation of misfit dislocations is generally known as plastic relaxation. As misfit dislocations are generated and stress is relieved, the crystalline material 32 may return substantially to its natural lattice constant above the critical thickness. FIG. 2B illustrates misfit dislocations 34 in the crystalline material 32, a critical thickness $t_c$, and a thickness $t_{nat}$ of the crystalline material 32 where the crystalline material 32 is substantially relaxed to its natural lattice constant. Although discussed on the assumption of infinite lateral, in-plane dimensions, this model generally applies to a material with significantly large enough lateral, in-plane dimensions, although portions near lateral surfaces may experience other effects, as a person having ordinary skill in the art will readily understand.

FIG. 2C illustrates elastic relaxation in the crystalline material 32. Elastic relaxation is generally the relieving of stress without generating misfit dislocations, such as by allowing the lattice structure of the epitaxially grown material to expand or contract to its natural lattice constant once stress is relieved through a free surface. In FIG. 2C, sufficient free surfaces are created by restricting the area on the top surface of the crystalline substrate 30 in which the epitaxial growth occurs. By restricting the area, essentially, there is a large free surface area, e.g., the lateral surfaces of the crystalline material 32, for the amount of crystalline material 32 epitaxially grown. In this instance, there is a free surface because there is no force at the surface to counter-balance the force caused by the stress in the crystalline material 32. Without a counter-balancing force, the lattice of the crystalline material 32 is allowed to expand or contract to its natural lattice constant. FIG. 2C illustrates a thickness $t_{elast}$ of the crystalline material 32 where elastic relaxation occurs by expansion.

It should be noted that whether and the extent to which elastic relaxation may occur depends on many factors. Such factors may include the lattice mismatch, the lateral dimensions, and the thickness of the epitaxially grown material. Further, it should be noted that an epitaxially grown crystalline material may experience both elastic and plastic relaxation. For example, if lateral dimensions are not sufficient for full elastic relaxation, the crystalline material may undergo elastic relaxation, particularly near a free surface, until it reaches a thickness in which misfit dislocations are generated for plastic relaxation. A typical example includes significant elastic relaxation near lateral surfaces of the crystalline material and significant plastic relaxation near a center of the crystalline material, such that misfit dislocations may be generated near the center but not near the lateral edges. As another example, an epitaxially grown crystalline material may experience substantially only elastic relaxation in one lateral direction and substantially only plastic relaxation in the other lateral direction. A typical example would be where the crystalline material has one significantly small lateral dimension and one significantly large lateral dimension. The elastic relaxation may be in the direction of the small lateral dimension, while the plastic relaxation may be in the large lateral dimension.

Figure 3:
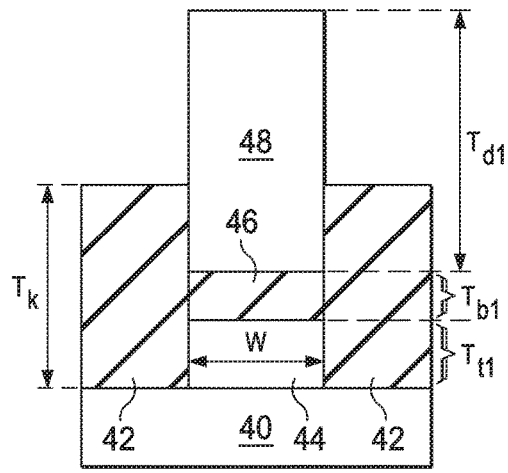
FIG. 3 is a heterostructure according to a first embodiment.

FIG. 3 illustrates a heteroepitaxial structure according to a first embodiment. The structure includes a substrate 40, a dielectric material 42, a crystalline template layer 44, a crystalline barrier layer 46, and a crystalline device layer 48. The substrate 40 includes a crystalline material at an interface with the crystalline template layer 44. The substrate 40 can be a bulk substrate, a semiconductor-on-insulator (SOI) substrate, or the like, and can comprise silicon (Si), silicon germanium (SiGe), germanium (Ge), silicon carbide (SiC), indium arsenide (InAs), or the like, which may be the crystalline material at the interface with the crystalline template layer 44. The dielectric material 42 is on a top surface of the substrate 40, and can comprise an insulating material, such as silicon oxide (SiO), silicon nitride (SiN), or the like. The dielectric material 42 has a thickness $T_k$ and has a trench extending the thickness $T_k$, e.g., from a top surface of the dielectric material 42 to the top surface of the substrate 40. The crystalline template layer 44 is disposed in the trench, and the trench has a width W and a length L (not shown in FIG. 3) in a plane parallel to the top surface of the substrate 40. The trench is defined by sidewalls of the dielectric material 42. In this embodiment, the sidewalls are vertical, such as perpendicular to the top surface of the substrate 40, and the width W of the trench is uniform throughout the thickness $T_k$ of the dielectric material 42, e.g., traversing the vertical direction. In practice, some deviation from vertical may occur due to processing, such that the width W may not be perfectly uniform, but such processing deviations may result in a uniform width W, as understood in the art. In other embodiments, the sidewalls may have any acceptable configuration. For example, many different configurations of sidewalls have been used for aspect ratio trapping (ART) of dislocations in an epitaxially grown material. These different configurations are considered within the scope of embodiments.

The crystalline template layer 44 is disposed in the trench and adjoins the top surface of the substrate 40 in this embodiment. Other embodiments contemplate other materials, such as a buffer layer or cladding layer, between the substrate 40 and the crystalline template layer 44. The crystalline template layer 44 interfaces with the substrate 40 on a planar surface, and other embodiments contemplate, for example, a recess in the substrate 40 such that the interface can include vertical and/or slanted sidewalls of the substrate 40. The crystalline template layer 44 can be any crystalline material. In some embodiments, the crystalline template layer 44 is lattice mismatched to the crystalline material of the substrate 40 near the interface with the crystalline template layer 44. Further, in some embodiments, the crystalline template layer 44 is lattice mismatched or lattice matched to the crystalline device layer 48. In embodiments where the crystalline template layer 44 is lattice mismatched to the crystalline material of the substrate 40, the crystalline template layer 44 may absorb the lattice mismatch. For example, the crystalline template layer 44 may be relaxed primarily by plastic relaxation, and misfit dislocations generated by the plastic relaxation can be trapped at sidewalls of the trench using acceptable trapping mechanisms, such as ART or epitaxial necking. In these situations, the crystalline template layer 44 may be relaxed at its top surface, and the top surface of the crystalline template layer 44 may be substantially free from misfit dislocations, such as having a misfit dislocation density of $10^7$ cm$^{-2}$ or less, or more particularly of $10^5$ cm$^{-2}$ or less. Different trapping mechanism have different considerations, such as trench geometry, thickness $T_t$ of the crystalline template layer 44, orientation of the trench to the crystalline surface of the substrate 40, the face of the lattice of the substrate 40, the materials used in the surface of the substrate 40 and in the crystalline template layer 44, and the growth conditions of the crystalline template layer 44.

The crystalline barrier layer 46 is disposed in the trench and is over and adjoins the crystalline template layer 44. As discussed later, in other embodiments, a material may be disposed between the crystalline barrier layer 46 and the crystalline template layer 44. In some embodiments, the crystalline barrier layer 46 is a binary III-V compound semiconductor material. In further embodiments, the crystalline barrier layer 46 does not include aluminum, such as a binary III-V compound semiconductor material that does not include aluminum. The crystalline barrier layer 46 can be lattice matched or lattice mismatched to the crystalline template layer 44. Further, in some embodiments, the crystalline barrier layer 46 has a bandgap energy that is greater than the bandgap energy of the crystalline device layer 48. The crystalline barrier layer 46 can have a bandgap energy greater than 0.65 eV, for example. The higher bandgap energy of the crystalline barrier layer 46 may reduce leakage current from the crystalline device layer 48 when a device is formed and operational in the crystalline device layer 48. In the embodiment depicted in FIG. 3, the crystalline barrier layer 46 is disposed wholly in the trench, such that the combined thickness $T_{t1}$ of the crystalline template layer 44 and the thickness $T_{b1}$ of the crystalline barrier layer 46 is equal to or less than the thickness $T_k$ of the dielectric material 42 (e.g., $T_{t1}+T_{b1} \le T_k$).

In FIG. 3, the crystalline device layer 48 is disposed at least partially in the trench and adjoining and over the crystalline barrier layer 46. Other embodiments contemplate other materials disposed between the crystalline device layer 48 and the crystalline barrier layer 46. As shown in FIG. 3, the crystalline device layer 48 protrudes from the trench and may be used for non-planar devices, such as finFETs. The combined thickness $T_{t1}$ of the crystalline template layer 44, the thickness $T_{b1}$ of the crystalline barrier layer 46, and the thickness $T_{d1}$ of the crystalline device layer 48 is greater than the thickness $T_k$ of the dielectric material 42 (e.g., $T_{t1}+T_{b1}+T_{d1}>T_k$). In other embodiments, the crystalline device layer 48 may be disposed wholly within the trench and be co-planar with the top surface of the dielectric material 42. In such embodiments, the crystalline device layer 48 may be used for planar devices, such as planar FETs or optical devices. The combined thickness $T_{t1}$ of the crystalline template layer 44, the thickness $T_{b1}$ of the crystalline barrier layer 46, and the thickness $T_{d1}$ of the crystalline device layer 48 may be equal to the thickness $T_k$ of the dielectric material 42 (e.g., $T_{t1}+T_{b1}+T_{d1}=T_k$). In some embodiments, the crystalline device layer 48 is a high mobility material having a low bandgap energy, such as less than 1.4 eV.

The materials of the crystalline template layer 44 and the crystalline device layer 48 can generally be any semiconductor material, subject to any conditions for a respective embodiment. Specifically, the materials of the crystalline template layer 44 and the crystalline device layer 48 can be any III-V compound semiconductor, including any binary, ternary, or quaternary compound, such as InP, InAs, InSb, InGaAs, GaSb, InGaSb, or the like.

Figure 4:
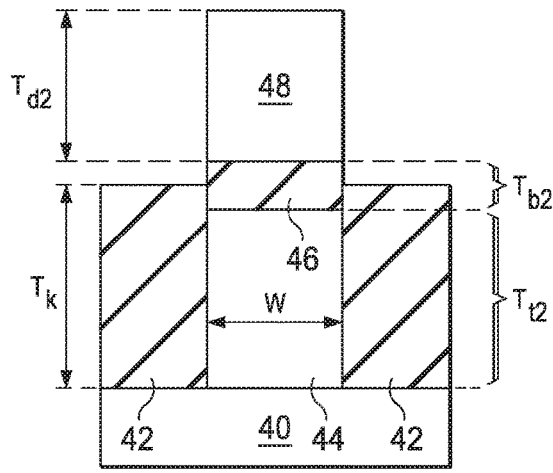
FIG. 4 is a heterostructure according to a second embodiment.

FIG. 4 illustrates a heteroepitaxial structure according to a second embodiment. In FIG. 4, the thickness $T_{t2}$ of the crystalline template layer 44 is greater than the thickness $T_{t1}$ in FIG. 3. The crystalline template layer 44 is disposed wholly in the trench, such that the thickness $T_k$ of the dielectric material 42 is greater than the thickness $T_{t2}$ of the crystalline template layer 44 (e.g., $T_{t2}<T_k$). The crystalline barrier layer 46 is disposed at least partially in the trench and has a thickness $T_{b2}$. The crystalline barrier layer 46 protrudes from the trench, such that the combined thickness $T_{t2}$ of the crystalline template layer 44 and thickness $T_{b2}$ of the crystalline barrier layer 46 is greater than the thickness $T_k$ of the dielectric material 42 (e.g., $T_{t2}+T_{b2}>T_k$). As will be discussed in detail below, the thickness $T_{b2}$ of the crystalline barrier layer 46 in FIG. 4 may be greater than thickness $T_{b1}$ of the crystalline barrier layer 46 in FIG. 3. The crystalline device layer 48 in FIG. 4 also has a thickness $T_{d2}$ that may be greater or less than or equal to the thickness $T_{d1}$ of the crystalline device layer 48 in FIG. 3.

Figure 5:
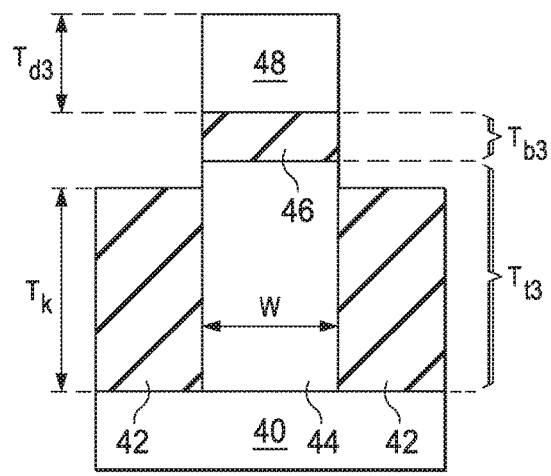
FIG. 5 is a heterostructure according to a third embodiment.

FIG. 5 illustrates a heteroepitaxial structure according to a third embodiment. In FIG. 5, the thickness $T_{t3}$ of the crystalline template layer 44 is greater than the thickness $T_{t2}$ in FIG. 4. The crystalline template layer 44 is disposed in the trench and protrudes from the trench, such that the thickness $T_k$ of the dielectric material 42 is less than the thickness $T_{t3}$ of the crystalline template layer 44 (e.g., $T_{t2}>T_k$). In other embodiments, the crystalline template layer 44 may have a top surface that is co-planar with a top surface of the dielectric material 42, such that the thickness $T_k$ of the dielectric material 42 is equal to the thickness $T_{t3}$ of the crystalline template layer 44 (e.g., $T_{t2}=T_k$). The crystalline barrier layer 46 has a thickness $T_{b3}$. As will be discussed in detail below, the thickness $T_{b3}$ of the crystalline barrier layer 46 in FIG. 5 may be greater than thickness $T_{b2}$ of the crystalline barrier layer 46 in FIG. 4. The crystalline device layer 48 in FIG. 5 also has a thickness $T_{d3}$ that may be greater or less than or equal to the thicknesses $T_{d1}$ and $T_{d2}$ of the crystalline device layer 48 in FIGS. 3 and 4, respectively.

Figure 6:
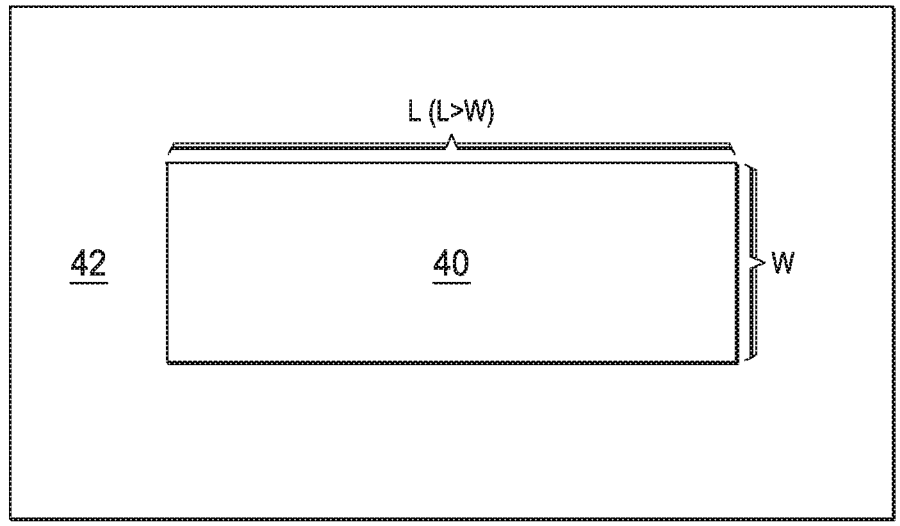
FIG. 6 is a first trench configuration according to an embodiment.
Figure 7:
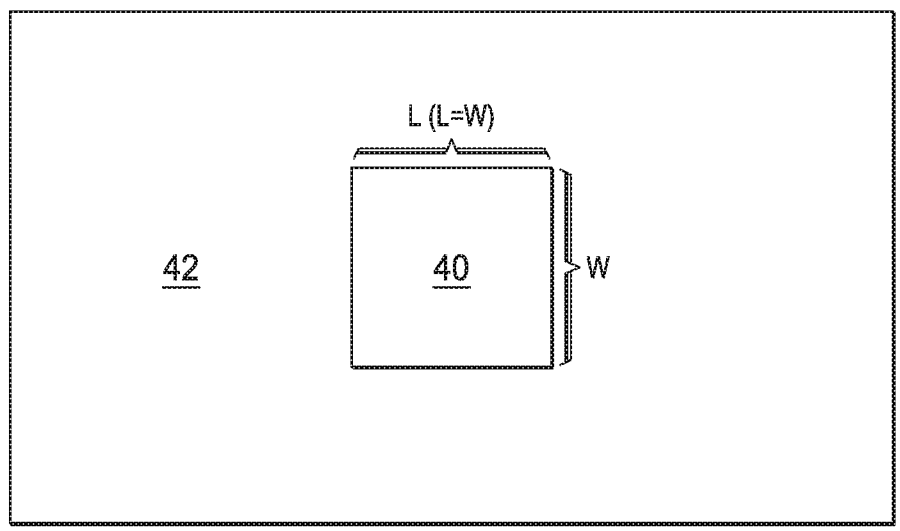
FIG. 7 is a second trench configuration according to another embodiment.

FIGS. 6 and 7 further illustrate aspects of the trench in FIGS. 3 through 5 according to embodiments. FIGS. 6 and 7 are plan views of the dielectric material 42 and the substrate 40, without the crystalline template layer 44, the crystalline barrier layer 46, and the crystalline device layer 48. FIGS. 6 and 7 illustrate a trench in the dielectric material 42 to the substrate 40. The trench in FIG. 6 has a length L greater than its width W. The trench in FIG. 7 has a length L equal to its W. Various dimensions are contemplated within embodiments. In some embodiments the trench can have a width W of approximately 40 nm to approximately 100 nm. In some embodiments, the trench can have a length L of greater than 1 μm, of approximately 120 nm, or of approximately 40 nm. In specific examples, a trench can have (1) a width W between 40 nm and 100 nm with a length of greater than 1 μm, (2) a width W between 40 nm and 100 nm with a length L of approximately 120 nm, or (3) a width W of approximately 40 nm and a length L of approximately 40 nm.

Thicknesses of the crystalline barrier layer 46 may vary in embodiments. In embodiments where the crystalline barrier layer 46 is substantially lattice matched to the underlying material, e.g., the crystalline template layer 44, there may be no restriction on the thickness $T_b$ of the crystalline barrier layer 46 based on misfit dislocation generation. In other embodiments where the crystalline barrier layer 46 is lattice mismatched to the underlying material, e.g., the crystalline template layer 44, some embodiments contemplate that the crystalline barrier layer 46 does not generate a substantial amount of misfit dislocations, e.g., no more than $10^7$ cm$^{-2}$, or more particularly $10^5$ cm$^{-2}$ For example, the thickness $T_b$ of the crystalline barrier layer 46 may not exceed a thickness at which a substantial amount of misfit dislocations are generated due to the lattice mismatch of the underlying material. This thickness at which a substantial amount of misfit dislocations may be generated may be greater than a critical thickness of the material under corresponding conditions given an infinite or near infinite planar film, e.g., infinite or large lateral dimensions as discussed above. The greater thickness without a substantial amount of misfit dislocations being generated may be achieved by allowing the crystalline barrier layer 46 to undergo some elastic relaxation at a free surface. In the examples in FIGS. 3 through 5, the thickness $T_{b1}$ may be greater than a critical thickness because the sidewalls of the crystalline barrier layer 46 are free surfaces where stress may be relieved. The presence of the dielectric material 42 may prevent some elastic relaxation, but generally does not prevent all because, for example, the crystalline barrier layer 46 does not nucleate on the dielectric material 42. Hence, the thickness $T_{b1}$ in FIG. 3 may be less than the thickness $T_{b2}$ in FIG. 4, which may be less than the thickness $T_{b3}$ in FIG. 5.

In further embodiments, the lateral dimensions of the trench in the dielectric material 42 may also affect the thickness of the crystalline barrier layer 46 at which a substantial amount of misfit dislocations are generated. As previously discussed with respect to FIG. 2C, the more the lateral dimensions, e.g., the width W and length L, of the trench are restricted, the more free surface area per amount of crystalline barrier layer 46 is available for elastic stress relief. Hence, assuming all other conditions to be the same, the thickness $T_{b1}$ in FIG. 3 may be greater when the length L and width W are smaller than larger. A similar analysis applies to each of the thickness $T_{b2}$ in FIG. 4 and the thickness $T_{b3}$ in FIG. 5.

Additionally, in some embodiments, the crystalline barrier layer 46 may experience substantial elastic relaxation in all lateral directions, while in other embodiments, may experience substantial elastic relaxation in one lateral direction but not in another. For example, if all lateral dimensions, such as shown in FIG. 7, are restricted to a small size, then the crystalline barrier layer 46 may experience elastic relaxation in all lateral directions. If, for example, one lateral dimension is restricted while another is large, such as in FIG. 6, the crystalline barrier layer 46 may experience elastic relaxation in the direction of the restricted dimension but may not experience substantial elastic relaxation in the direction of the other dimension. As one example, assuming the width W in FIGS. 6 and 7 are the same, the thickness of the crystalline barrier layer 46 at which misfit dislocations may be generated may be greater with respect to the configuration in FIG. 7 than that in FIG. 6. In other embodiments where one lateral dimension is restricted and the other is large, such as in FIG. 7, the crystalline barrier layer 46 may undergo elastic relaxation in the direction of the restricted dimension while undergoing plastic relaxation in the direction of the large dimension.

Although embodiments are discussed with respect to mechanisms for relaxation, the crystalline barrier layer 46 may be strained despite the presence of some relaxation. Any relaxation that the crystalline barrier layer 46 may undergo may allow for a greater thickness of the crystalline barrier layer 46 without a substantial amount of misfit dislocations being generated than would otherwise be available when the crystalline barrier layer 46 is lattice mismatched with the underlying material.

Although thicknesses of various materials in embodiments can be any value and may depend on various factors, such as materials and configurations used, some thicknesses are specifically contemplated in some embodiments. Specifically, the thickness $T_t$ of the crystalline template layer 44 can be between about 20 nm and about 100 nm, such as 40 nm; the thickness $T_b$ of the crystalline barrier layer 46 can be between about 4 nm and about 80 nm, such as 15 nm; and the thickness $T_d$ of the crystalline device layer 48 can be between about 5 nm and about 40 nm, such as about 20 nm.

Figure 8:
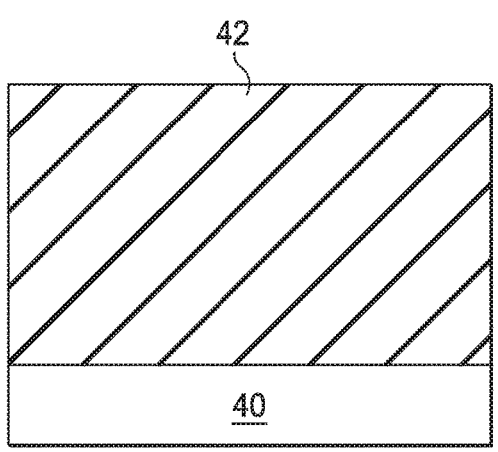
FIGS. 8 and 9 are a first method to form a trench according to an embodiment.
Figure 9:
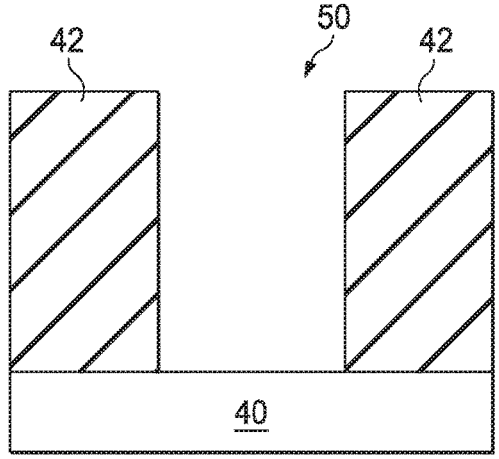

FIGS. 8 through 17 illustrate methods of forming a finFET according to an embodiment. FIGS. 8 and 9 illustrate a technique of forming a trench in the dielectric material 42, and FIGS. 10 through 13 illustrate another technique of forming a trench in the dielectric material 42.

Referring to a first technique of forming the trench beginning with FIG. 8, a layer of the dielectric material 42 is formed on the top surface of the substrate 40. The substrate 40 and the dielectric material 42 can comprise any of the respective components and materials previously discussed. The layer of the dielectric material 42 can be formed using, for example, a chemical vapor deposition (CVD) or the like.

In FIG. 9, the trench 50 is formed in the dielectric material 42 and exposes a portion of the top surface of the substrate 40. The trench can have any width and/or length, such as those previously discussed, particularly, with reference to acceptable ART techniques and to FIGS. 6 and 7. The trench 50 can be formed using, for example, an appropriate photolithography and anisotropic etch, such as a reactive ion etch (RIE). The substrate 40 may also be etched in other embodiments such that a recess in the substrate 40 is exposed through the trench 50.

Figure 10:
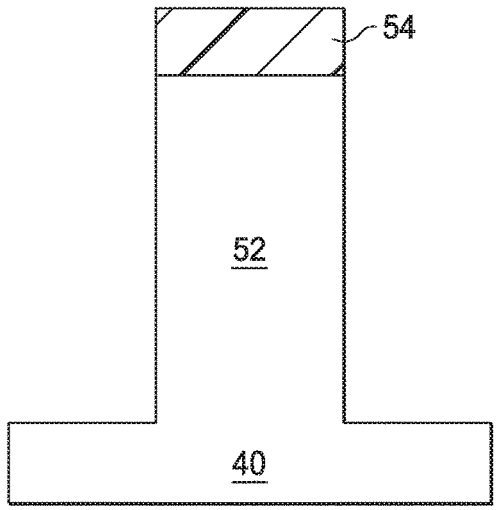
FIGS. 10 through 13 are a second method to form a trench according to another embodiment.

Referring to a second technique of forming the trench beginning with FIG. 10, the substrate 40 is patterned to form a protruding portion 52 that will correspond to the shape of the trench. The protruding portion 52 can be formed by patterning a mask 54, such as a photoresist, over a top surface of the substrate 40 and anisotropically etching the substrate 40, such as by using an RIE.

Figure 11:
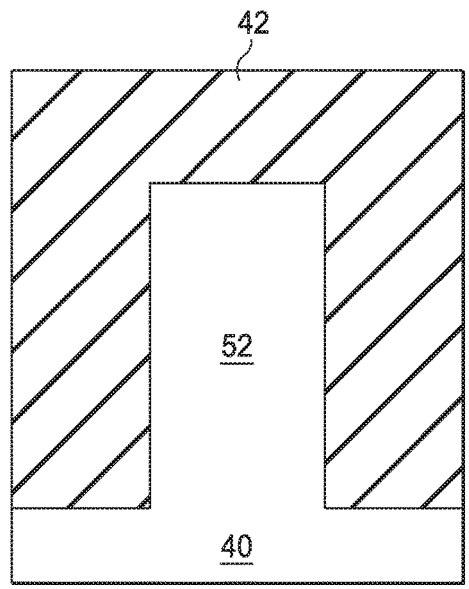
Figure 12:
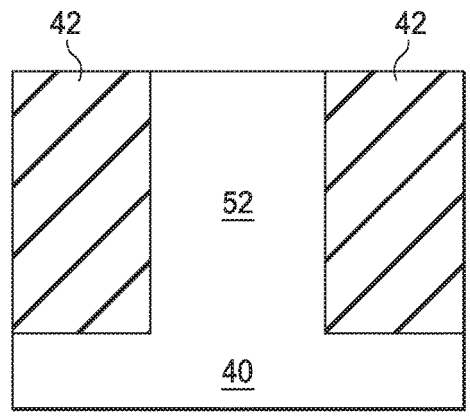
Figure 13:
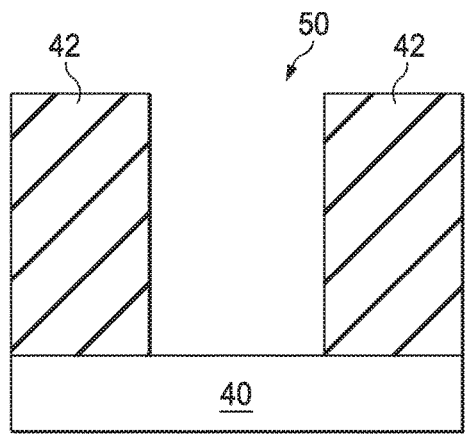

In FIG. 11, a layer of the dielectric material 42 is formed over the substrate 40 and over the protruding portion 52. The layer of the dielectric material 42 can be formed using, for example, a chemical vapor deposition (CVD) or the like. In FIG. 12, a planarization technique, such as a chemical mechanical polishing (CMP), is used to remove a portion of the dielectric material 42 to make top surfaces of the dielectric material 42 and protruding portion 52 co-planar. This can expose the top surface of the protruding portion 52. In FIG. 13, the protruding portion 52 is at least partially removed, such as by using an etch, to form the trench 50. In some embodiments, not all of the protruding portion 52 is removed such that a portion of the protruding portion 52 remains in the trench 50, and in other embodiments, the protruding portion 52 is over-etched such that a recess in the substrate 40 is formed below the trench 50. The trench can have any width and/or length, such as those previously discussed, particularly, with reference to acceptable ART techniques and to FIGS. 6 and 7.

Figure 14:
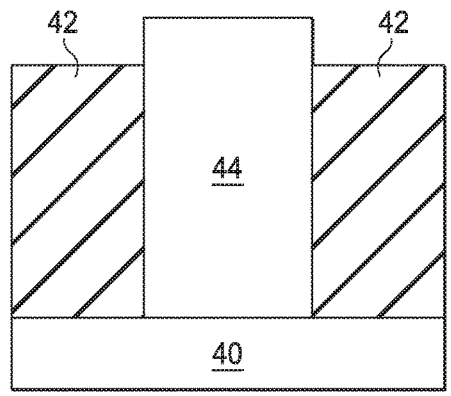
FIGS. 14 through 17 are a method of forming a heterostructure for a semiconductor device according to an embodiment.

In FIG. 14, the crystalline template layer 44 is grown in the trench 50 formed by the technique in FIGS. 8 and 9, the technique in FIGS. 10 through 13, or the like. The crystalline template layer 44 can be grown using acceptable selective epitaxial growth techniques like metal-organic CVD (MOCVD), molecular beam epitaxy (MBE), or the like. The crystalline template layer 44 can be in any configuration, including any thickness, that is discussed above with respect to FIGS. 3 through 5 (the configuration of FIG. 5 is shown as the example in FIG. 14 and following). If the crystalline template layer 44 is lattice mismatched with the underlying adjoining material, such as the crystalline material of the substrate 40, the crystalline template layer 44 can be configured such that misfit dislocations are trapped at sidewalls of the trench in the dielectric material 42. The top surface of the crystalline template layer 44 can be relaxed and have a misfit dislocation density of less than $10^7$ cm$^{-2}$, or more specifically, less than $10^5$ cm$^{-2}$.

Figure 15:
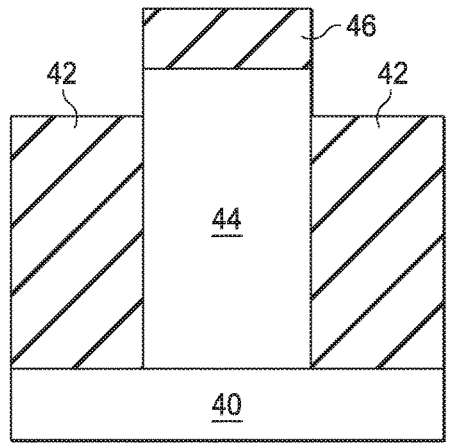

In FIG. 15, the crystalline barrier layer 46 is grown over the crystalline template layer 44. The crystalline barrier layer 46 can be grown using acceptable selective epitaxial growth techniques like MOCVD, MBE, or the like. As discussed above, the crystalline barrier layer 46 can have a thickness that is greater than its critical thickness with infinite or near infinite lateral dimensions without a substantial amount of misfit dislocations being generated due to a lattice mismatch with the underlying adjoining material, such as the crystalline template layer 44. For example, the top surface of the crystalline barrier layer 46 can have a misfit dislocation density of less than $10^7$ cm$^{-2}$, or more specifically, less than $10^5$ cm$^{-2}$.

Figure 16:
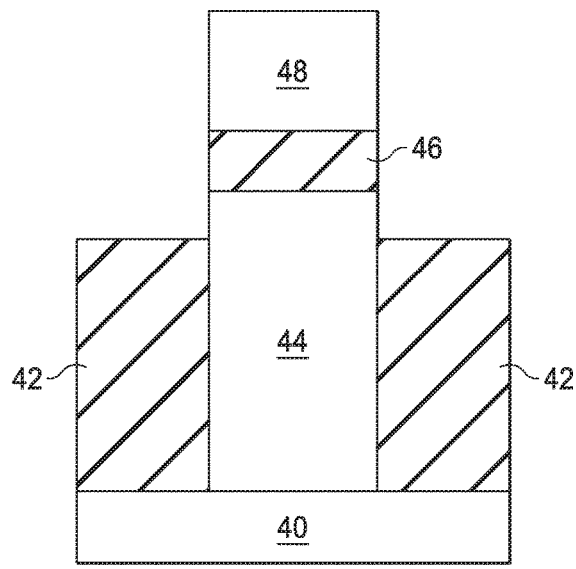

In FIG. 16, the crystalline device layer 48 is grown over the crystalline barrier layer 46. The crystalline device layer 48 can be grown using acceptable selective epitaxial growth techniques like MOCVD, MBE, or the like. The crystalline device layer 48 can have a misfit dislocation density of less than $10^7$ cm$^{-2}$, or more specifically, less than $10^5$ cm$^{-2}$.

Although not discussed above, any of the crystalline template layer 44, the crystalline barrier layer 46, and the crystalline device layer 48 that is epitaxially grown protruding from the trench can be grown under conditions that suppress lateral growth of the material. In such a manner, any of the crystalline template layer 44, the crystalline barrier layer 46, and the crystalline device layer 48 can have sidewalls that correspond vertically to the sidewalls of the trench in the dielectric material 42.

Figure 17:
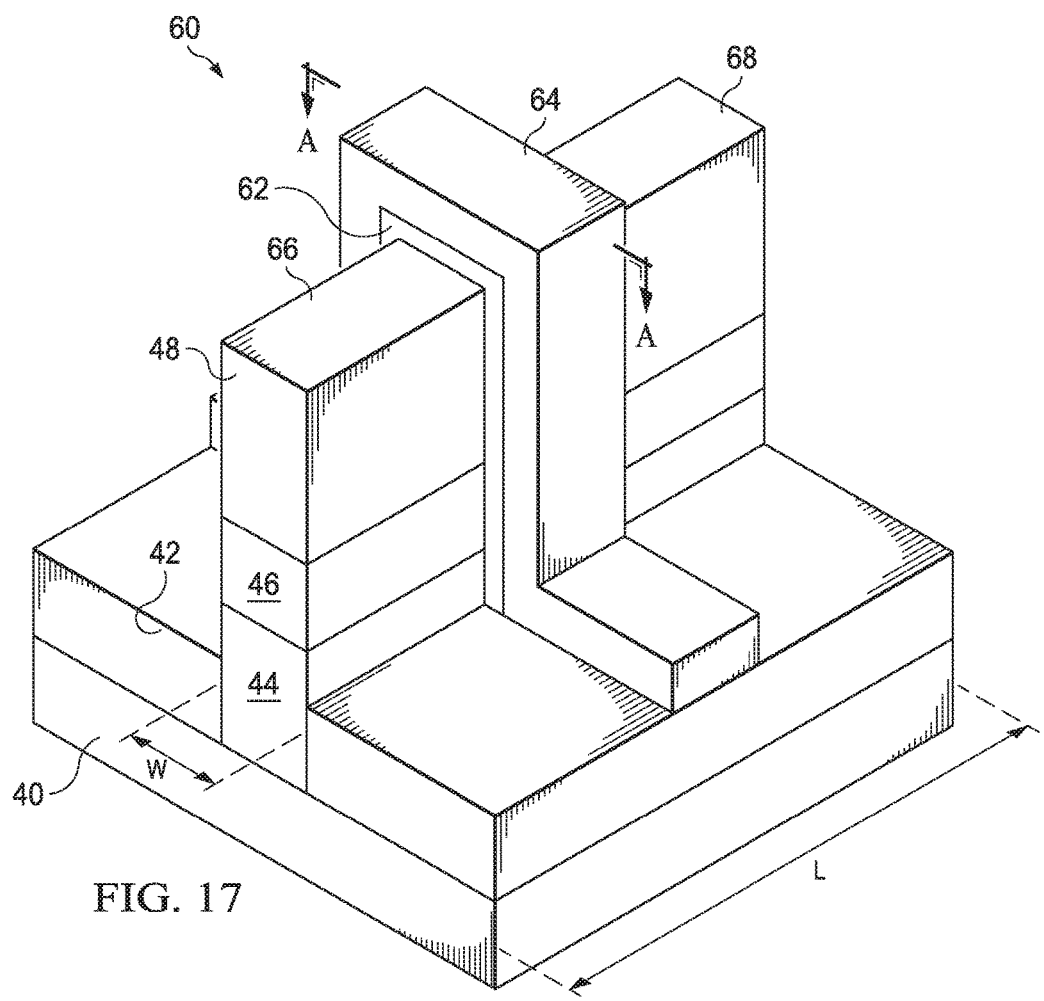

FIG. 17 illustrates forming a device using the structure of FIG. 16 (e.g., the structure of FIG. 3, 4, or 5). FIG. 17 is a three-dimensional view of an example device, e.g., a finFET 60. The cross-section A-A in FIG. 17 is the cross-section illustrated in views of previous intermediate steps of the example methods. In FIG. 17, a gate dielectric 62 and a gate electrode 64 are formed along sidewalls and on the top surface of the crystalline device layer 48. The device layer 48 forms at least a portion of a fin in this embodiment. If portions of the crystalline barrier layer 46 and/or the crystalline template layer 44 protrude from the trench, the gate dielectric 62 and gate electrode 64 can also be along sidewalls of those materials that protrude from the trench of the dielectric material 42, such as depicted in FIG. 17. Further, those protruding portions of the crystalline barrier layer 46 and/or the crystalline template layer 44 may form a portion of the fin.

A layer of the gate dielectric 62 can be deposited conformally over the structure, such as on the top surfaces and the sidewalls of crystalline device layer 48. In some embodiments, the gate dielectric 62 can comprise silicon oxide, silicon nitride, or multilayers thereof. In other embodiments, gate dielectric 62 comprises a high-k dielectric material, and in these embodiments, gate dielectric 62 may have a k value greater than about 7.0, and may include a metal oxide or a silicate of Hf, Al, Zr, La, Mg, Ba, Ti, Pb, and combinations thereof. The formation methods of the layer of the gate dielectric 62 may include Molecular-Beam Deposition (MBD), Atomic Layer Deposition (ALD), Plasma Enhanced Chemical Vapor Deposition (PECVD), and the like. Next, a layer of gate electrode 64 is deposited over the layer of gate dielectric 62. Gate electrode 64 may comprise a conductive material such as polysilicon and/or a metal-containing material such as TiN, TaN, TaC, Co, Ru, Al, combinations thereof, or multi-layers thereof. Acceptable photolithography and etching techniques can be used to pattern the layers of the gate dielectric 62 and the gate electrode 64 into the gate dielectric 62 and gate electrode 64 shown in FIG. 17.

FIG. 17 further illustrates source/drain regions 66 and 68 that are disposed in the crystalline device layer 48 and are oppositely disposed each other with respect to the gate dielectric 62 and gate electrode 64. Source/drains may be formed in the source/drain regions 66 and 68 by implanting a dopant, e.g., n-type or p-type, into the crystalline device layer 48. Other components of the finFET 60 are not explicitly shown, but persons having ordinary skill in the art will readily understand that embodiments contemplate such components. For example, the finFET 60 may include lightly doped source/drains (LDDs) and gate spacers. Further, an etch stop layer can be formed over the finFET 60, and an inter-layer dielectric (ILD) can be formed over the etch stop layer. Further, inter-metal dielectrics (IMD) with their corresponding metallization patterns can be formed over the ILD.

The following lists materials for device applications for a finFET according to different embodiments.

Figure 18:
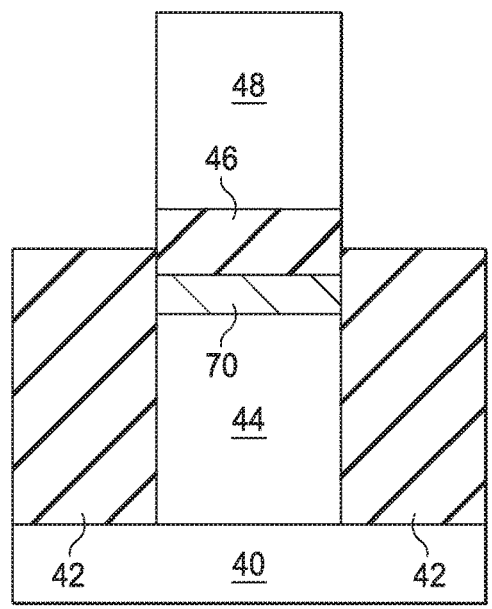
FIG. 18 is a heterostructure including an aluminum containing material according to an embodiment.

1. 5.8 Å crystalline device layer 48 lattice constant for an n-type finFET:
   a. Crystalline template layer 44: InP
   b. Crystalline barrier layer 46: InP
   c. Crystalline device layer 48: InGaAs
2. 5.8 Å crystalline device layer 48 lattice constant for a p-type finFET:
   a. Crystalline template layer 44: InP
   b. Crystalline barrier layer 46: InP
   c. Crystalline device layer 48: GaSb and/or InGaSb
3. 6.1 Å crystalline device layer 48 lattice constant for an n-type finFET:
   a. Crystalline template layer 44: InAs
   b. Crystalline barrier layer 46: InP and/or GaSb
   c. Crystalline device layer 48: InAs and/or InGaAs
4. 6.1 Å crystalline device layer 48 lattice constant for an n-type or p-type finFET:
   a. Crystalline template layer 44: InAs
   b. Crystalline barrier layer 46: InP
   c. Crystalline device layer 48: GaSb and/or InGaSb
5. 6.4 Å crystalline device layer 48 lattice constant for an n-type finFET:
   a. Crystalline template layer 44: InSb
   b. Crystalline barrier layer 46: InP
   c. Crystalline device layer 48: InSb FIG. 18 illustrates a modification to an embodiment. In FIG. 18, an aluminum containing material 70 is disposed between the crystalline template layer 44 and the crystalline barrier layer 46. In an embodiment, the aluminum containing material 70 is a binary compound comprising aluminum, such as aluminum oxide ($Al_2O_3$). Further, in some embodiments, the aluminum containing material 70 may act as an additional barrier layer. It should be noted that any of the structures illustrated in FIGS. 3 through 5 may include a similar aluminum containing material 70 between the crystalline template layer 44 and the crystalline barrier layer 46.

Figure 19:
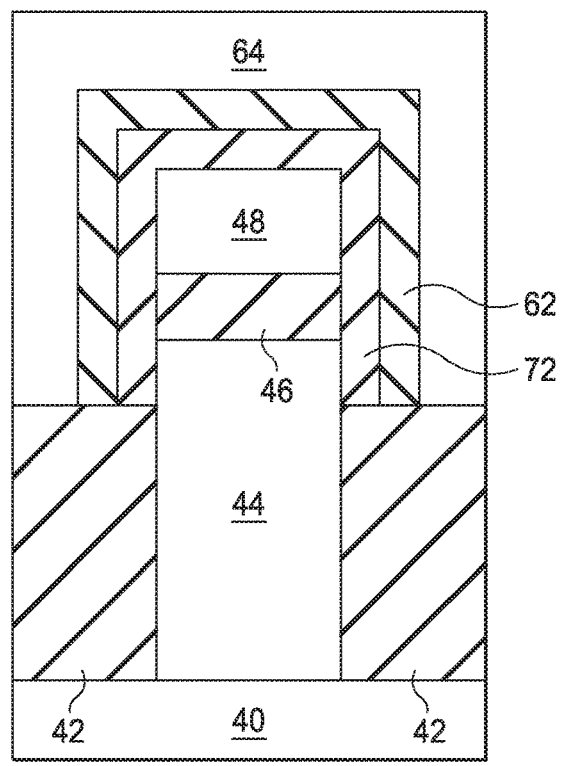
FIG. 19 is a heterostructure including a barrier shell according to an embodiment.

FIG. 19 illustrates another modification to an embodiment. In FIG. 19, a barrier shell 72 is formed over the top surface and along sidewalls of the crystalline device layer 48. The barrier shell 72 can be formed on a channel of the finFET 60, such as disposed between the crystalline device layer 48 and the gate dielectric 62. If portions of the crystalline barrier layer 46 and/or the crystalline template layer 44 protrude from the trench, the barrier shell 72 can also be along sidewalls of those materials that protrude from the trench of the dielectric material 42. Further, the barrier shell 72 can encapsulate any portion of the crystalline device layer 48, the crystalline barrier layer 46, and/or crystalline template layer 44 that protrudes from the trench. As an example, the barrier shell 72 can comprise InP when the crystalline template layer 44 comprises InAs, the crystalline barrier layer 46 comprises InP, and the crystalline device layer 48 comprises InAs. It should be noted that any of the structures illustrated in FIGS. 3 through 5 may include a similar barrier shell 72.

According to some embodiments, a dislocation free heterostructure comprising III-V compound semiconductors with significant lattice mismatch can be achieved for devices, such as a finFET. A crystalline device layer 48 may be low strained, such as less than 0.2%. Further, a barrier layer that does not use aluminum and that is a binary compound may be used to simplify processing.

One embodiment includes a method that includes removing portions of a substrate to form a temporary fin protruding above the substrate, forming a dielectric material over the substrate and over the temporary fin, and removing the temporary fin to form a trench in the dielectric material, the trench exposing a portion of a first crystalline material of the substrate. The method also includes forming a template material disposed at least partially in the trench, in which the template material comprises a second crystalline material that is lattice mismatched to the first crystalline material and is a different semiconductor than the first crystalline material. The method also includes forming a barrier material over the template material, wherein the barrier material comprises a third crystalline material, and wherein the barrier material comprises a binary III-V compound semiconductor. The method also includes forming a device material over the barrier material, wherein the device material comprises a fourth crystalline material, forming a gate stack over the device material, and forming a first source/drain region and a second source/drain region in the device material.

Another embodiment includes a method that includes forming a dielectric material over a substrate, the substrate comprising a first semiconductor material. The method also includes removing a portion of the dielectric material to expose a top surface of the substrate, wherein a portion of the exposed top surface comprises the first semiconductor material, and forming a template material over and contacting the exposed top surface of the substrate, wherein the template material comprises a second semiconductor material that is lattice mismatched to the first semiconductor material and is a different semiconductor than the first semiconductor material. The method also includes forming a first barrier material over the template material, wherein the first barrier material comprises aluminum, forming a second barrier material over the first barrier material, wherein the second barrier material comprises a binary III-V compound semiconductor, and forming a device material over the second barrier material, wherein the device material comprises a third semiconductor material. The method also includes forming a gate dielectric over the device material, forming a gate electrode over the gate dielectric, and forming at least one source/drain region in the device material adjacent the gate dielectric.

A further embodiment includes a structure that includes a substrate comprising a first crystalline material and a crystalline template layer protruding from the substrate, wherein the crystalline template layer comprises a second crystalline material different from the first crystalline material and lattice mismatched to the first crystalline material. The structure also includes a dielectric material over the substrate and adjacent to the crystalline template layer, wherein a top surface of the dielectric material extends a smaller distance from the substrate than a top surface of the crystalline template layer. The structure also includes a crystalline barrier layer over the crystalline template layer, the crystalline barrier layer comprising a third semiconductor material different from the second crystalline material and includes a crystalline device layer over the crystalline barrier layer, the crystalline device layer comprising a fourth semiconductor material different from the third semiconductor material. The structure also includes a gate stack over crystalline device layer and contacting a sidewall of the crystalline template layer and includes a first source/drain region and a second source/drain region in the crystalline device layer, wherein the gate stack is disposed between the first source/drain region and the second source/drain region.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   removing portions of a substrate to form a temporary fin protruding above a first surface of the substrate;
   forming a dielectric material over the substrate and over the temporary fin;
   removing the temporary fin to form a trench in the dielectric material and to form a recess in the substrate below the trench, the trench exposing a portion of a first crystalline material of the substrate within the recess;
   forming a template material in the recess and disposed at least partially in the trench, the template material comprising a second crystalline material that is lattice mismatched to the first crystalline material, that is a binary III-V compound semiconductor comprising indium, and that is a different semiconductor than the first crystalline material;
   forming a barrier material over and physically contacting a top surface of the template material, the barrier material comprising a third crystalline material comprising a first composition of indium phosphide, the first composition of indium phosphide extending from a bottom surface of the barrier material to a top surface of the barrier material;

forming a device material over and physically contacting the top surface of the barrier material, the device material comprising a fourth crystalline material, wherein sidewalls of the template material are free of the device material, wherein sidewalls of the barrier material are free of the device material, wherein the fourth crystalline material comprises a binary, ternary, and/or quaternary of a III-V semiconductor compound;

forming a gate stack over the device material; and forming a first source/drain region and a second source/drain region in the device material.

2. The method of claim 1, further comprising forming an aluminum containing layer disposed between the template material and the barrier material.

3. The method of claim 1 further comprising forming a barrier shell layer over a top surface and sidewalls of the device material.

4. The method of claim 1, wherein the barrier material has a thickness greater than a critical thickness of the barrier material, wherein the critical thickness of the barrier material is defined for an infinite planar film of the barrier material.

5. The method of claim 1, wherein the device material is formed having sidewalls substantially flush with the sidewalls of the barrier material.

6. The method of claim 1, wherein the template material has a substantially square lateral cross-section.

7. The method of claim 1, wherein the gate stack directly contacts the template material.

8. The method of claim 1, wherein the second crystalline material comprises indium arsenide.

9. A method comprising:

forming a dielectric material over a substrate, the substrate comprising a first semiconductor material;

removing a portion of the dielectric material to expose a top surface of the substrate, wherein a portion of the exposed top surface comprises the first semiconductor material;

forming a template material over and physically contacting the exposed top surface of the substrate, the template material comprising a second semiconductor material that is lattice mismatched to the first semiconductor material and is a different semiconductor than the first semiconductor material;

forming a first barrier material over and physically contacting the template material, wherein the first barrier material comprises a dielectric material comprising aluminum, wherein the first barrier material is a different material than the template material, and wherein the first barrier material has a uniform composition throughout the first barrier material;

forming a second barrier material over and physically contacting the first barrier material, the second barrier material comprising a binary III-V compound semiconductor, wherein the second barrier material is a different material than the first barrier material, and wherein the second barrier material has a uniform composition throughout the second barrier material;

forming a device material over and physically contacting the second barrier material, the device material comprising a third semiconductor material that is a different material than the second barrier material, wherein the second barrier material has a greater bandgap energy than the device material;

forming a gate dielectric over the device material, the gate dielectric physically contacting a top surface of the device material;

forming a gate electrode over the gate dielectric; and forming at least one source/drain region in the device material adjacent the gate dielectric.

10. The method of claim 9 further comprising forming a barrier shell layer over a top surface and sidewalls of the device material.

11. The method of claim 9, wherein each of the template material and the device material comprises a binary, ternary, and/or quaternary of a III-V semiconductor compound.

12. The method of claim 9, wherein the second barrier material is an elastically relaxed layer.

13. The method of claim 9, wherein the first barrier material, the second barrier material, and the device material have coplanar sidewalls.

14. The method of claim 9, wherein the template material extends above a top surface of the dielectric material.

15. The method of claim 14, wherein the gate dielectric directly contacts the template material.

16. A structure comprising:

a substrate comprising a first crystalline material;

a crystalline template layer protruding from the substrate, wherein the crystalline template layer comprises a second crystalline material different from the first crystalline material and lattice mismatched to the first crystalline material, the crystalline template layer having a uniform composition throughout the crystalline template layer comprising a III-V binary compound semiconductor;

a dielectric material over the substrate and adjacent to the crystalline template layer, wherein a top surface of the dielectric material extends a smaller distance from the substrate than a top surface of the crystalline template layer;

a crystalline barrier layer over and physically contacting the crystalline template layer, the crystalline barrier layer comprising a third crystalline material different from the second crystalline material;

a crystalline device layer over and physically contacting a top surface of the crystalline barrier layer, the crystalline device layer comprising a fourth crystalline material different from the third crystalline material, the crystalline device layer comprising a III-V binary compound semiconductor, wherein a bottommost surface of the crystalline device layer is a greater distance from the substrate than the top surface of the crystalline template layer, wherein the sidewalls of the crystalline barrier layer are free of the fourth crystalline material, and wherein a thickness of the crystalline device layer is greater than a thickness of the crystalline barrier layer;

a gate stack over the crystalline device layer and contacting a sidewall of the crystalline template layer; and a first source/drain region and a second source/drain region in the crystalline device layer, wherein the gate stack is disposed between the first source/drain region and the second source/drain region.

17. The structure of claim 16, wherein the crystalline barrier layer is a relaxed layer.

18. The structure of claim 16, wherein the sidewalls of the crystalline barrier layer are coplanar with the respectively adjacent sidewalls of the crystalline device layer.

19. The structure of claim 16, wherein the template layer has sides of substantially equal length in plan view.

20. The structure of claim 16, further comprising forming a barrier shell layer over a top surface and sidewalls of the crystalline device layer.

\* \* \* \* \*